(12) United States Patent
An

(10) Patent No.: US 12,341,524 B2
(45) Date of Patent: Jun. 24, 2025

(54) CLOCK GENERATION CIRCUIT, AND SEMICONDUCTOR DEVICE AND SEMICONDUCTOR SYSTEM USING THE CLOCK GENERATION CIRCUIT

(71) Applicant: SK hynix Inc., Icheon-si Gyeonggi-do (KR)

(72) Inventor: Young Jae An, Icheon-si Gyeonggi-do (KR)

(73) Assignee: SK hynix Inc., Icheon-si (KR)

( * ) Notice: Subject to any disclaimer, the term of this patent is extended or adjusted under 35 U.S.C. 154(b) by 14 days.

(21) Appl. No.: 18/478,667

(22) Filed: Sep. 29, 2023

(65) Prior Publication Data

US 2024/0405777 A1 Dec. 5, 2024

(30) Foreign Application Priority Data

May 30, 2023 (KR) .......................... 10-2023-0069037

(51) Int. Cl.
*H03L 7/081* (2006.01)
*H03K 5/156* (2006.01)
*H03L 7/085* (2006.01)
*H04L 7/00* (2006.01)

(52) U.S. Cl.
CPC ......... *H03L 7/0816* (2013.01); *H03K 5/1565* (2013.01); *H03L 7/085* (2013.01); *H04L 7/0037* (2013.01)

(58) Field of Classification Search
CPC ........ H03K 5/1565; H03K 5/156; H03K 5/00; H03K 3/017; H03K 3/01; H03K 3/00; H03K 2005/00019; H03K 2005/00078; H03K 2005/00013
See application file for complete search history.

(56) References Cited

U.S. PATENT DOCUMENTS

| 8,736,330 | B2 * | 5/2014 | Chung ................. H03K 5/1565 |
| | | | 327/175 |
| 9,197,202 | B2 * | 11/2015 | Jang ....................... H03K 5/131 |
| 10,659,058 | B1 | 5/2020 | Cheng et al. |
| 11,349,457 | B2 * | 5/2022 | Kim ...................... H03L 7/0812 |

FOREIGN PATENT DOCUMENTS

KR 102222622 B1 3/2021

* cited by examiner

*Primary Examiner* — Diana J. Cheng
(74) *Attorney, Agent, or Firm* — WILLIAM PARK & ASSOCIATES LTD.

(57) ABSTRACT

A clock generation circuit includes a delay-locked circuit and a duty correction circuit. The delay-locked circuit generates a delay clock signal by delaying an input clock signal and update the delay time of the input clock signal. The duty correction circuit generates a first phase clock signal and a second phase clock signal by delaying the delay clock signal, and updates the delay time of the delay clock signal. The duty correction circuit can prevent or mitigate the delay time of the input clock signal and the delay time of the delay clock signal from being updated simultaneously.

22 Claims, 8 Drawing Sheets

(54)	CLOCK GENERATION CIRCUIT, AND SEMICONDUCTOR DEVICE AND SEMICONDUCTOR SYSTEM USING THE CLOCK GENERATION CIRCUIT

CROSS-REFERENCES TO RELATED APPLICATION

The present application claims priority under 35 U.S.C. § 119 (a) to Korean Patent Application No. 10-2023-0069037, filed on May 30, 2023, in the Korean Intellectual Property Office, which is incorporated herein by reference in its entirety.

BACKGROUND

1. Technical Field

The present technology generally relates to an integrated circuit technology, and more particularly, to a clock generation circuit, and a semiconductor device and a semiconductor system using the clock generation circuit.

2. Related Art

An electronic device includes many electronic components. Among the electronic components, a computer system may include many semiconductor devices composed of a semiconductor. The semiconductor devices that constitute the computer system may communicate with each other by transmitting and receiving clock signals and data. The semiconductor devices may transmit and receive data in synchronization with a clock signal. The semiconductor devices may transmit and/or receive system clock signals to and/or from an outside device (i.e., another semiconductor device), and may transmit and receive data in synchronization with the system clock signal. The semiconductor devices may each include a clock buffer and/or a receiver, may receive the system clock signal, and may transmit the received system clock signal to an internal circuit related to a data input and output operation and an internal circuit that operates in synchronization with a clock signal. A phase difference may occur between the clock signal received by the internal circuit and the system clock signal due to a delay time occurring within the semiconductor device. Accordingly, the semiconductor devices each include a clock generation circuit so that such a phase difference can be compensated for. The clock generation circuit may include a variable delay line, and may generate an internal clock signal from the system clock signal. Furthermore, the clock generation circuit may generate a plurality of internal clock signals having difference phases. The clock generation circuit includes a duty cycle correction circuit capable of compensating for phase differences between the plurality of internal clock signals.

SUMMARY

In an embodiment, a clock generation circuit may include a delay-locked circuit and a duty correction circuit. The delay-locked circuit may be configured to generate a delay clock signal by delaying an input clock signal and configured to update a delay time of the input clock signal by comparing phases of the input clock signal and a feedback clock signal. The duty correction circuit may be configured to generate a first phase clock signal and a second phase clock signal by delaying the delay clock signal, configured to update a delay time of the delay clock signal by comparing phases of the first and second phase clock signals, and configured to prevent or mitigate the delay time of the input clock signal and the delay time of the delay clock signal from being updated simultaneously.

In an embodiment, a clock generation circuit may include a delay-locked circuit, a duty correction circuit, a second phase detector, and a delay control circuit. The delay-locked circuit may be configured to generate a first delay control signal by comparing an input clock signal and a feedback clock signal and configured to generate a delay clock signal by delaying the input clock signal in response to the first delay control signal. The duty correction circuit may be configured to generate a first phase clock signal by delaying the delay clock signal and configured to generate a second phase clock signal by delaying the delay clock signal in response to a second delay control signal. The second phase detector may be configured to generate a second phase detection signal by comparing phases of the first and second phase clock signals. The second delay control circuit may be configured to generate a second delay control signal in response to the second phase detection signal and configured to selectively provide the second delay control signal to the duty correction circuit in response to the first delay control signal.

DETAILED DESCRIPTION

It will be understood that although the terms "first," "second," "third," etc. are used herein to describe various elements, these elements should not be limited by these terms. These terms are only used to distinguish one element from another element and are not intended to imply an order or number of elements. Thus, a first element in some embodiments could be termed a second element in other embodiments without departing from the teachings of the present disclosure.

Figure 1:
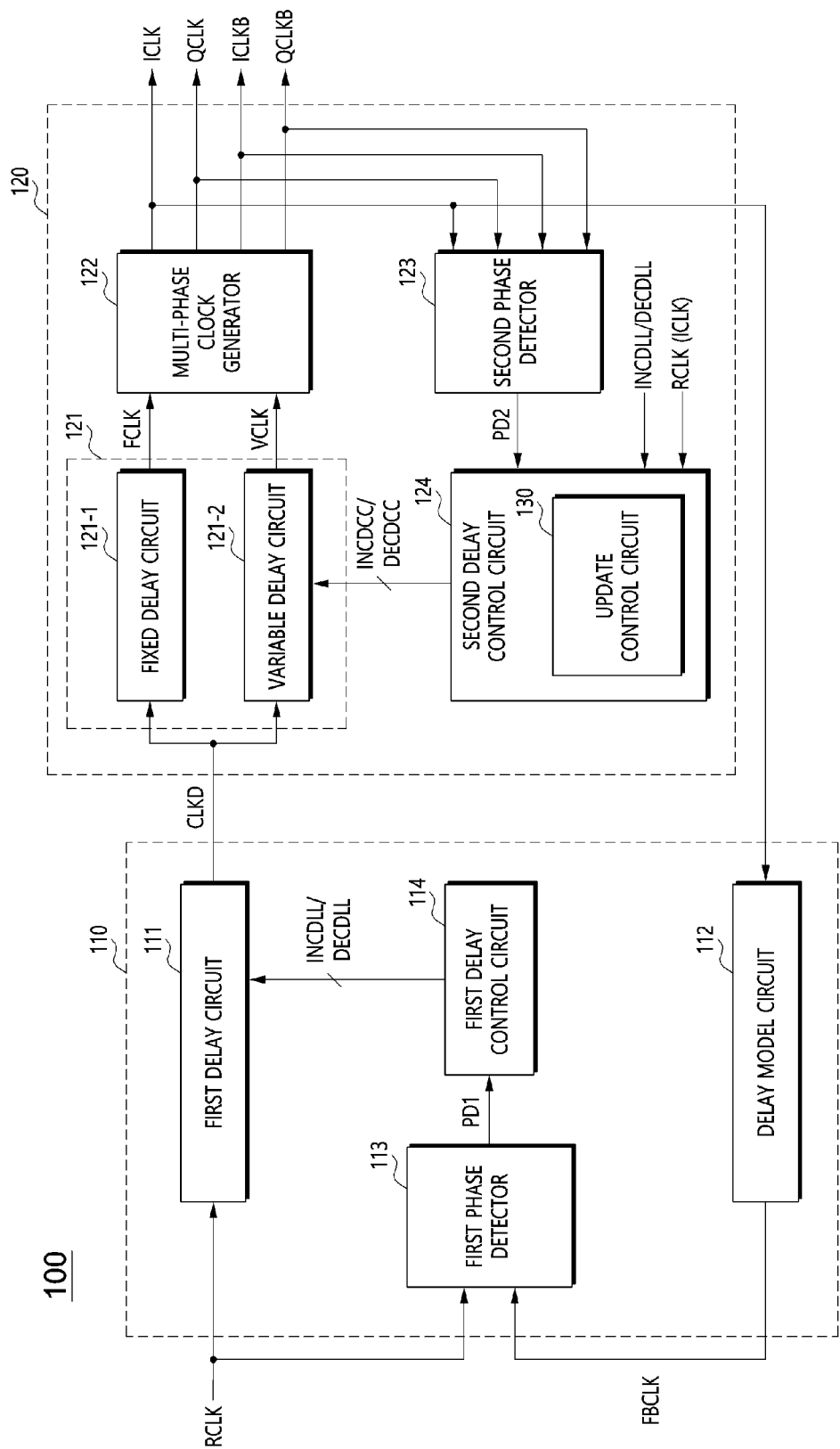
FIG. 1 is a diagram illustrating a construction of a clock generation circuit according to an embodiment.

FIG. 1 is a diagram illustrating a construction of a clock generation circuit 100 according to an embodiment. Referring to FIG. 1, the clock generation circuit 100 may generate a plurality of phase clock signals by receiving an input clock signal RCLK. The clock generation circuit 100 may generate the plurality of phase clock signals by delaying the input clock signal RCLK. The clock generation circuit 100 may delay the input clock signal RCLK in order to compensate for a delay time occurring to a clock path along which the input clock signal RCLK and the plurality of phase clock signals are transmitted within a semiconductor device including the clock generation circuit 100. The clock generation circuit 100 may detect the phases of the plurality of phase clock signals, and may adjust phase differences between the plurality of phase clock signals. The plurality of phase clock signals may include at least a first phase clock signal ICLK and a second phase clock signal QCLK. The first phase clock signal ICLK may have a phase difference of 90 degrees from the second phase clock signal QCLK. The first phase clock signal ICLK may have a phase earlier than the phase of the second phase clock signal QCLK. The clock generation circuit 100 may further generate a third phase clock signal ICLKB and a fourth phase clock signal QCLKB. The third phase clock signal ICLKB may be a complementary signal of the first phase clock signal ICLK, and may have a phase that is later than the phase of the second phase clock signal QCLK by 90 degrees. The fourth phase clock signal QCLKB may be a complementary signal of the second phase clock signal QCLK. The fourth phase clock signal QCLKB may have a phase that is later than the phase of the third phase clock signal ICLKB by 90 degrees, and may have a phase that is earlier than the phase of the first phase clock signal ICLK by 90 degrees.

The clock generation circuit 100 may include a delay-locked circuit 110 and a duty correction circuit 120. The delay-locked circuit 110 may receive the input clock signal RCLK, and may generate a delay clock signal CLKD by delaying the input clock signal RCLK. The delay-locked circuit 110 may generate the delay clock signal CLKD by performing a delay-locked operation on the input clock signal RCLK. The delay-locked circuit 110 may compare the phases of the input clock signal RCLK and a feedback clock signal FBCLK, and may change the delay time of the input clock signal RCLK based on a result of the comparison between the phases. The delay-locked circuit 110 may update the delay time of the input clock signal RCLK until the input clock signal RCLK and the feedback clock signal FBCLK are in-phase. The delay-locked circuit 110 may be locked when the input clock signal RCLK and the feedback clock signal FBCLK are in-phase, and might not change the delay time of the input clock signal RCLK. Thereafter, when a phase difference between the input clock signal RCLK and the feedback clock signal FBCLK is greater than a predetermined range, the locking state of the delay-locked circuit 110 may be released. The delay-locked circuit 110 may change the delay time of the input clock signal RCLK again. The update cycle of the delay-locked circuit 110 may be arbitrarily set. For example, the update cycle of the delay-locked circuit 110 may correspond to the cycle of a division clock signal that is generated by dividing the frequency of the input clock signal RCLK or the frequency of one of the plurality of phase clock signals by n. In this case, "n" may be an integer equal to or greater than 2. The update cycle of the delay-locked circuit 110 may be variously adjusted depending on the type (e.g., a coarse delay-locked operation or a fine delay-locked operation) of delay-locked operation of the delay-locked circuit 110 and whether the delay-locked circuit 110 has been locked. For example, the update cycle of the delay-locked circuit 110 may be relatively short before the delay-locked circuit 110 is locked, and may be relatively long after the delay-locked circuit 110 is locked. The feedback clock signal FBCLK may be generated from at least one of the plurality of phase clock signals. The delay-locked circuit 110 may generate the feedback clock signal FBCLK by delaying at least one of the plurality of phase clock signals. For example, the delay-locked circuit 110 may generate the feedback clock signal FBCLK by delaying the first phase clock signal ICLK. The delay-locked circuit 110 may generate the feedback clock signal FBCLK by delaying the first phase clock signal ICLK by a delay compensation time. The delay compensation time may correspond to a delay time occurring in the clock path along which the input clock signal RCLK and the plurality of phase clock signals are transmitted. The word "predetermined" as used herein with respect to a parameter, such as a predetermined range, time, and cycle, means that a value for the parameter is determined prior to the parameter being used in a process or algorithm. For some embodiments, the value for the parameter is determined before the process or algorithm begins. In other embodiments, the value for the parameter is determined during the process or algorithm but before the parameter is used in the process or algorithm.

The duty correction circuit 120 may generate the plurality of phase clock signals by delaying the delay clock signal CLKD. The duty correction circuit 120 may generate at least the first and second phase clock signals ICLK and QCLK by delaying the delay clock signal CLKD. The duty correction circuit 120 may further generate the third and fourth phase clock signals ICLKB and QCLKB by delaying the delay clock signal CLKD. The duty correction circuit 120 may adjust a difference between the phases of the first to fourth phase clock signals ICLK, QCLK, ICLKB, and QCLKB. The duty correction circuit 120 may compare the phases of the first to fourth phase clock signals ICLK, QCLK, ICLKB, and QCLKB, and may change the delay time of the delay clock signal ICLK based on a result of the comparison between the phases. The duty correction circuit 120 may update the delay time of the delay clock signal CLKD until a difference between the phases of the first to fourth phase clock signals ICLK, QCLK, ICLKB, and QCLKB is constant. The update cycle of the duty correction circuit 120 may be arbitrarily set. For example, the update cycle of the duty correction circuit 120 may be determined based on a division clock signal that is generated by dividing the frequency of the input clock signal RCLK or the frequency of at least one of the plurality of phase clock signals. The update cycle of the duty correction circuit 120 may be different from the update cycle of the delay-locked circuit 110, and may be set independently of the update cycle of the delay-locked circuit 110.

The duty correction circuit 120 may operate independently of the delay-locked circuit 110. The duty correction circuit 120 may perform a duty correction operation while the delay-locked circuit 110 performs a delay-locked operation. When the delay time of the input clock signal RCLK is updated before the delay-locked circuit 110 is locked, the duty correction circuit 120 may also update the delay time of the delay clock signal CLKD. When the update of the delay-locked circuit 110 and the update of the duty correction circuit 120 are simultaneously performed, a phase difference between the first and second phase clock signals ICLK and QCLK may be excessively increased because a phase difference between the first and second phase clock signals ICLK and QCLK is over-compensated for. Accordingly, the duty correction circuit 120 may prevent or mitigate the delay time of the input clock signal RCLK and the delay time of the delay clock signal CLKD from being updated simultaneously. In this case, "updated simultaneously" may mean that the update operation interval of the duty correction circuit 120 at least partially overlaps the update operation interval of the delay-locked circuit 110. When the update operation interval of the duty correction circuit 120 at least partially overlaps the update operation interval of the delay-locked circuit 110, the duty correction circuit 120 might not perform an update operation, and the delay-locked circuit 110 may preferentially perform an update operation. The duty correction circuit 120 can maintain a phase difference between the first and second phase clock signals ICLK and QCLK within a proper range without overcompensating for a phase difference between the first and second phase clock signals ICLK and QCLK by preventing or mitigating the delay-locked circuit 110 and the duty correction circuit 120 from being updated simultaneously.

The delay-locked circuit 110 may include a first delay circuit 111, a delay model circuit 112, a first phase detector 113, and a first delay control circuit 114. The first delay circuit 111 may receive the input clock signal RCLK and a first delay control signal INCDLL or DECDLL. The first delay circuit 111 may generate the delay clock signal CLKD by delaying the input clock signal RCLK in response to the first delay control signal INCDLL or DECDLL. The first delay circuit 111 may be a variable delay circuit the delay time of which is changed in response to the first delay control signal INCDLL or DECDLL. Although not illustrated, the first delay circuit 111 may include a plurality of unit delay cells and a shift register capable of selectively turning on the plurality of unit delay cells. The first delay circuit 111 may increase or decrease the number of unit delay cells that are turned on, among the plurality of unit delay cells, by increasing or decreasing the logic value of a signal that is generated by the shift register step by step in response to the first delay control signal INCDLL or DECDLL. The first delay circuit 111 may be a digitally controlled delay line. In an embodiment, the first delay circuit 111 may be a voltage-controlled delay line. When the first delay circuit 111 is the voltage-controlled delay line, the first delay circuit 111 may change the delay amount of the plurality of unit delay cells by adjusting the level of a voltage that is applied to the plurality of unit delay cells, in response to the first delay control signal INCDLL or DECDLL.

The delay model circuit 112 may receive the first phase clock signal ICLK. The delay model circuit 112 may generate the feedback clock signal FBCLK by delaying the first phase clock signal ICLK. The delay model circuit 112 may generate the feedback clock signal FBCLK by delaying the first phase clock signal ICLK by the delay compensation time. The delay model circuit 112 may include circuits that are obtained by modeling a delay time occurring in the clock path in order to delay the first phase clock signal ICLK by the delay compensation time.

The first phase detector 113 may receive the input clock signal RCLK and the feedback clock signal FBCLK. The first phase detector 113 may generate a first phase detection signal PD1 in response to the input clock signal RCLK and the feedback clock signal FBCLK. The first phase detector 113 may generate the first phase detection signal PD1 by detecting the phases of the input clock signal RCLK and the feedback clock signal FBCLK. The first phase detection signal PD1 may have a different logic level depending on whether the input clock signal RCLK has a phase that is earlier or later than the phase of the feedback clock signal FBCLK. For example, when the input clock signal RCLK has a phase earlier than the phase of the feedback clock signal FBCLK, the first phase detector 113 may generate the first phase detection signal PD1 having a logic high level. When the input clock signal RCLK has a phase later than the phase of the feedback clock signal FBCLK, the first phase detector 113 may generate the first phase detection signal PD1 having a logic low level. The first phase detector 113 may generate the first phase detection signal PD1 by detecting the phases of the input clock signal RCLK and the feedback clock signal FBCLK every update cycle of the delay-locked circuit 110.

The first delay control circuit 114 may receive the first phase detection signal PD1, and may generate the first delay control signal INCDLL or DECDLL. The first delay control circuit 114 may generate the first delay control signal INCDLL or DECDLL based on the logic level of the first phase detection signal PD1. The first delay control signal INCDLL or DECDLL may include a first increase signal INCDLL and a first decrease signal DECDLL. The first delay control circuit 114 may generate the first increase signal INCDLL and the first decrease signal DECDLL in a pulse form. When the first phase detection signal PD1 has a logic high level, the first delay control circuit 114 may generate the first increase signal INCDLL in order to increase the delay time of the first delay circuit 111. When the first phase detection signal PD1 has a logic low level, the first delay control circuit 114 may generate the first decrease signal DECDLL in order to decrease the delay time of the first delay circuit 111. In an embodiment, the first delay control circuit 114 may generate the first increase signal INCDLL when receiving the first phase detection signal PD1 having a logic high level consecutively at least two times or more, and may generate the first decrease signal DECDLL when receiving the first phase detection signal PD1 having a logic low level consecutively at least two times or more. When alternately receiving the first phase detection signal PD1 having a logic high level and the first phase detection signal PD1 having a logic low level, the first delay control circuit 114 may generate a locking signal that provides notification that the delay-locked circuit 110 has been locked without generating the first increase signal INCDLL and the second decrease signal DECDLL. If the delay-locked circuit 110 has not been locked, the first delay control circuit 114 may receive the first phase detection signal PD1 every update cycle of the delay-locked circuit 110, and may generate the first increase signal INCDLL or the first decrease signal DECDLL in response to the first phase detection signal PD1. The first delay control circuit 114 may provide the first delay control signal INCDLL or DECDLL to the duty correction circuit 120.

The duty correction circuit 120 may include a second delay circuit 121, a multi-phase clock generator 122, a second phase detector 123, and a second delay control circuit 124. The second delay circuit 121 may receive the delay clock signal CLKD and a second delay control signal INCDCC or DECDCC. The second delay circuit 121 may generate a fixed delay clock signal FCLK by delaying the delay clock signal CLKD, and may generate a variable delay clock signal VCLK by delaying the delay clock signal CLKD in response to the second delay control signal INCDCC or DECDCC. The second delay circuit 121 may generate the fixed delay clock signal FCLK by delaying the delay clock signal CLKD by a locked delay time. The second delay circuit 121 may generate the variable delay clock signal VCLK by delaying the delay clock signal CLKD by a delay time that varies in response to the second delay control signal INCDCC or DECDCC.

The second delay circuit 121 may include a fixed delay circuit 121-1 and a variable delay circuit 121-2. The fixed delay circuit 121-1 may receive the delay clock signal CLKD, and may generate the fixed delay clock signal FCLK by delaying the delay clock signal CLKD by the locked delay time. The variable delay circuit 121-2 may receive the delay clock signal CLKD and the second delay control signal INCDCC or DECDCC, and may generate a variable delay clock signal VCLK by variably delaying the delay clock signal CLKD in response to the second delay control signal INCDCC or DECDCC. In an embodiment, the default delay time of the variable delay circuit 121-2 may be longer than the fixed delay time of the fixed delay circuit 121-1 by a half cycle of the delay clock signal CLKD. In an embodiment, the fixed delay clock signal FCLK may have a phase that is earlier than the phase of the variable delay clock signal VCLK by 180 degrees.

The multi-phase clock generator 122 may receive the fixed delay clock signal FCLK and the variable delay clock signal VCLK from the second delay circuit 121. The multi-phase clock generator 122 may generate the first to fourth phase clock signals ICLK, QCLK, ICLKB, and QCLKB in response to the fixed delay clock signal FCLK and the variable delay clock signal VCLK. The fixed delay clock signal FCLK may be substantially in-phase with the first phase clock signal ICLK. The variable delay clock signal VCLK may be substantially in-phase with the second phase clock signal QCLK. The multi-phase clock generator 122 may generate the first phase clock signal ICLK and the third phase clock signal ICLKB by dividing the frequency of the fixed delay clock signal FCLK. The multi-phase clock generator 122 may generate the second phase clock signal QCLK and the fourth phase clock signal QCLKB by dividing the frequency of the variable delay clock signal VCLK. In an embodiment, the duty correction circuit 120 might not include the multi-phase clock generator 122. The fixed delay clock signal FCLK may be provided as the first phase clock signal ICLK. The variable delay clock signal VCLK may be provided as the second phase clock signal QCLK.

The second phase detector 123 may receive the first to fourth phase clock signals ICLK, QCLK, ICLKB, and QCLKB from the multi-phase clock generator 122. The second phase detector 123 may generate a second phase detection signal PD2 by comparing the phases of the first to fourth phase clock signals ICLK, QCLK, ICLKB, and QCLKB. The second phase detector 123 may compare the phases of the first to fourth phase clock signals ICLK, QCLK, ICLKB, and QCLKB in various ways. For example, the second phase detector 123 may generate the second phase detection signal PD2 by generating a reference signal that is triggered by the edges of the first and third phase clock signals ICLK and ICLKB, generating a comparison signal that is triggered by the edges of the second and fourth phase clock signals QCLK and QCLKB, and detecting the duty ratio of the reference signal and the comparison signal. The type of phase clock signal that is used to generate the reference signal and the comparison signal and which edge, among rising edges and falling edges of the phase clock signals, will be used may be variously changed. In an embodiment, the second phase detector 123 may generate the second phase detection signal PD2 by comparing the sum of a pulse width that is generated from a rising edge of the first phase clock signal ICLK to a rising edge of the second phase clock signal QCLK and a pulse width that is generated from a rising edge of the third phase clock signal ICLKB to a rising edge of the fourth phase clock signal QCLKB and the sum of a pulse width that is generated from the rising edge of the second phase clock signal QCLK to the rising edge of the third phase clock signal ICLKB and a pulse width that is generated from the rising edge of the fourth phase clock signal QCLKB to the rising edge of the first phase clock signal ICLK. For example, the second phase detector 123 may generate the second phase detection signal PD2 having a logic low level when the duty ratio of the reference signal is greater than the duty ratio of the comparison signal, and may generate the second phase detection signal PD2 having a logic high level when the duty ratio of the reference signal is smaller than the duty ratio of the comparison signal. The second phase detector 123 may generate the second phase detection signal PD2 by comparing the phases of the first to fourth phase clock signals ICLK, QCLK, ICLKB, and QCLKB every update cycle of the duty correction circuit 120. In an embodiment, if the multi-phase clock generator 122 is not provided, the second phase detector 123 may generate the second phase detection signal PD2 by detecting the duty ratio of the first phase clock signal ICLK and the second phase clock signal QCLK.

The second delay control circuit 124 may receive the second phase detection signal PD2 and the first delay control signal INCDLL or DECDLL. The second delay control circuit 124 may generate the second delay control signal INCDCC or DECDCC in response to the second phase detection signal PD2 and the first delay control signal INCDLL or DECDLL. The second delay control circuit 124 may generate the second delay control signal INCDCC or DECDCC in response to the second phase detection signal PD2, and may selectively provide the second delay control signal INCDCC or DECDCC to the second delay circuit 121 in response to the first delay control signal INCDLL or DECDLL. The second delay control signal INCDCC or DECDCC may include a second increase signal INCDCC and a second decrease signal DECDCC. For example, the second delay control circuit 124 may generate the second decrease signal DECDCC when receiving the second phase detection signal PD2 having a logic low level, and may generate the second increase signal INCDCC when receiving the second phase detection signal PD2 having a logic high level. The variable delay circuit 121-2 may advance the phase of the variable delay clock signal VCLK by decreasing the delay time of the delay clock signal CLKD when receiving the second decrease signal DECDCC. The variable delay circuit 121-2 may delay the phase of the variable delay clock signal VCLK by increasing the delay time of the delay clock signal CLKD when receiving the second increase signal INCDCC. The second delay control circuit 124 may generate the second delay control signal INCDCC or DECDCC in a pulse form. The second delay control circuit 124 may receive the second phase detection signal PD2 every update cycle of the duty correction circuit 120, and may generate the second increase signal INCDCC or the second decrease signal DECDCC in response to the second phase detection signal PD2. The second delay control circuit 124 can block the second delay control signal INCDCC or DECDCC from being provided to the second delay circuit 121, when the pulse of the second delay control signal INCDCC or DECDCC at least partially overlap the pulse of the first delay control signal INCDLL or DECDLL.

The second delay control circuit 124 may generate a preliminary delay control signal in response to the second phase detection signal PD2. The preliminary delay control signal may be the raw signal of the second delay control signal INCDCC or DECDCC. The second delay control circuit 124 may selectively output the preliminary delay control signal as the second delay control signal INCDCC or DECDCC in response to the first delay control signal INCDLL or DECDLL. The preliminary delay control signal may include a preliminary increase signal and a preliminary decrease signal. The second delay control circuit 124 may output the preliminary increase signal as the second increase signal INCDCC, and may output the preliminary decrease signal as the second decrease signal DECDCC.

The second delay control circuit 124 may include an update control circuit 130. The update control circuit 130 may selectively output the preliminary delay control signal as the second delay control signal INCDCC or DECDCC in response to the first delay control signal INCDLL or DECDLL. The update control circuit 130 might not output the preliminary delay control signal as the second delay control signal INCDCC or DECDCC when the preliminary delay control signal is generated simultaneously with the first delay control signal INCDLL or DECDLL. The update control circuit 130 can block the preliminary delay control signal from being output as the second delay control signal INCDCC or DECDCC when the pulse of the preliminary delay control signal at least partially overlaps the pulse of the first delay control signal INCDLL or DECDLL. The update control circuit 130 may provide the preliminary delay control signal as the second delay control signal INCDCC or DECDCC when the pulse of the preliminary delay control signal does not overlap the pulse of the first delay control signal INCDLL or DECDLL. The update control circuit 130 may receive at least one of the input clock signal RCLK and the first to fourth phase clock signals ICLK, QCLK, ICLKB, and QCLKB. For example, the update control circuit 130 may set the update cycle of the duty correction circuit 120 in response to the input clock signal RCLK. The update control circuit 130 may receive the first phase clock signal ICLK instead of the input clock signal RCLK, and may set the update cycle of the duty correction circuit 120 in response to the first phase clock signal ICLK.

Figure 2:
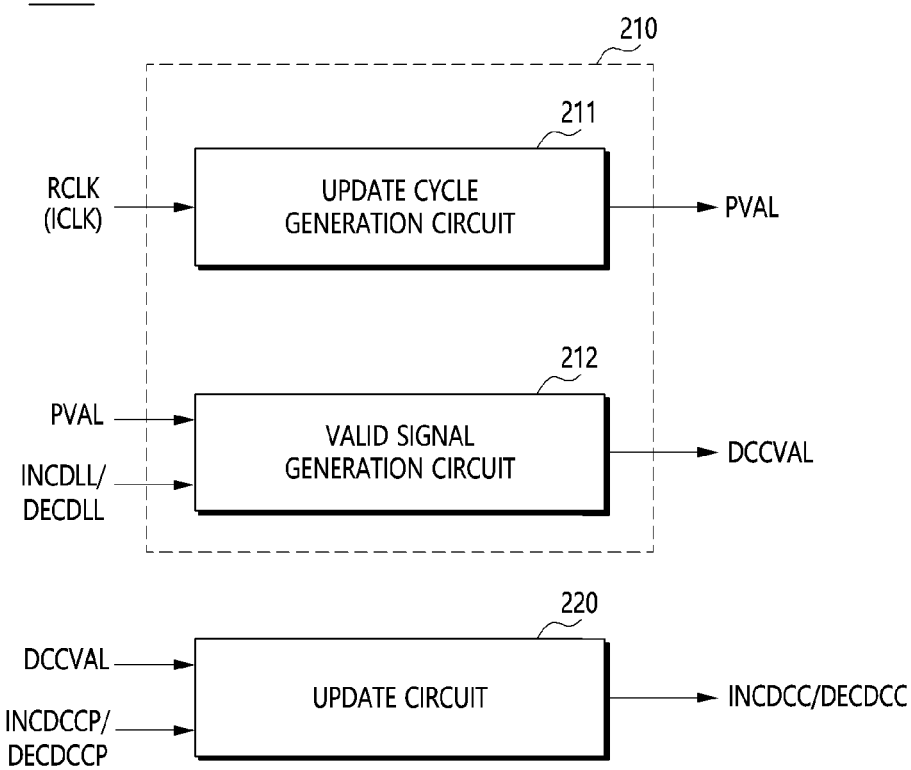
FIG. 2 is a diagram illustrating a construction of an update control circuit illustrated in FIG. 1.

FIG. 2 is a diagram illustrating a construction of the update control circuit 130 illustrated in FIG. 1. Referring to FIG. 2, the update control circuit 130 may include a cycle control circuit 210 and an update circuit 220. The cycle control circuit 210 may set the update cycle of the duty correction circuit 120 in response to the input clock signal RCLK or the first phase clock signal ICLK, and may generate an update cycle signal PVAL every update cycle. The cycle control circuit 210 may selectively provide the update cycle signal PVAL as a valid signal DCCVAL in response to the first delay control signal INCDLL or DECDLL. Although the update cycle signal PVAL is enabled in the state in which the first delay control signal INCDLL or DECDLL has been enabled, the cycle control circuit 210 might not provide the update cycle signal PVAL as the valid signal DCCVAL. The cycle control circuit 210 may output the update cycle signal PVAL as the valid signal DCCVAL in the state in which the first delay control signal INCDLL or DECDLL has been disabled.

The cycle control circuit 210 may include an update cycle generation circuit 211 and a valid signal generation circuit 212. The update cycle generation circuit 211 may generate the update cycle signal PVAL in response to the input clock signal RCLK or the first phase clock signal ICLK. The update cycle generation circuit 211 may generate a division clock signal by dividing the frequency of the input clock signal RCLK or the first phase clock signal ICLK by m. In this case, "m" may be an integer equal to or greater than 2. The update cycle generation circuit 211 may generate an oscillating signal in synchronization with the division clock signal, and may generate a plurality of clock signals by sequentially delaying the oscillating signal. The update cycle generation circuit 211 may generate the update cycle signal PVAL having a pulse that is enabled every predetermined cycle in response to the division clock signal and at least some of the plurality of clock signals.

The valid signal generation circuit 212 may receive the update cycle signal PVAL and the first delay control signal INCDLL or DECDLL. The valid signal generation circuit 212 may generate the valid signal DCCVAL in response to the update cycle signal PVAL and the first delay control signal INCDLL or DECDLL. The valid signal generation circuit 212 may generate the valid signal DCCVAL by delaying the update cycle signal PVAL by a predetermined time. The predetermined time may be arbitrarily set. In an embodiment, the predetermined time may be for compensating for a propagation delay time of the delay clock signal CLKD from the delay-locked circuit 110 to the duty correction circuit 120. When the pulse of the first delay control signal INCDLL or DECDLL is generated during the predetermined time, the valid signal generation circuit 212 may reset the valid signal DCCVAL. The valid signal generation circuit 212 can prevent or mitigate the valid signal DCCVAL from being enabled, when the pulse of the first delay control signal INCDLL or DECDLL is generated during the time until the valid signal DCCVAL is generated after the update cycle signal PVAL is received although the update cycle signal PVAL is received.

The update circuit 220 may receive the valid signal DCCVAL and a preliminary delay control signal INCDCCP or DECDCCP. The preliminary delay control signal INCDCCP or DECDCCP may include a preliminary increase signal INCDCCP and a preliminary decrease signal DECDCCP. The update control circuit 220 may output the preliminary delay control signal INCDCCP or DECDCCP as the second delay control signal INCDCC or DECDCC in response to the valid signal DCCVAL. The update circuit 220 can block the preliminary delay control signal INCDCCP or DECDCCP from being output as the second delay control signal INCDCC or DECDCC in the state in which the valid signal DCCVAL has been disabled. When the valid signal DCCVAL is enabled, the update circuit 220 may output the preliminary delay control signal INCDCCP or DECDCCP as the second delay control signal INCDCC or DECDCC. The update circuit 220 may output the preliminary increase signal INCDCCP as the second increase signal INCDCC and output the preliminary decrease signal DECDCCP as the second decrease signal DECDCC.

Figure 3:
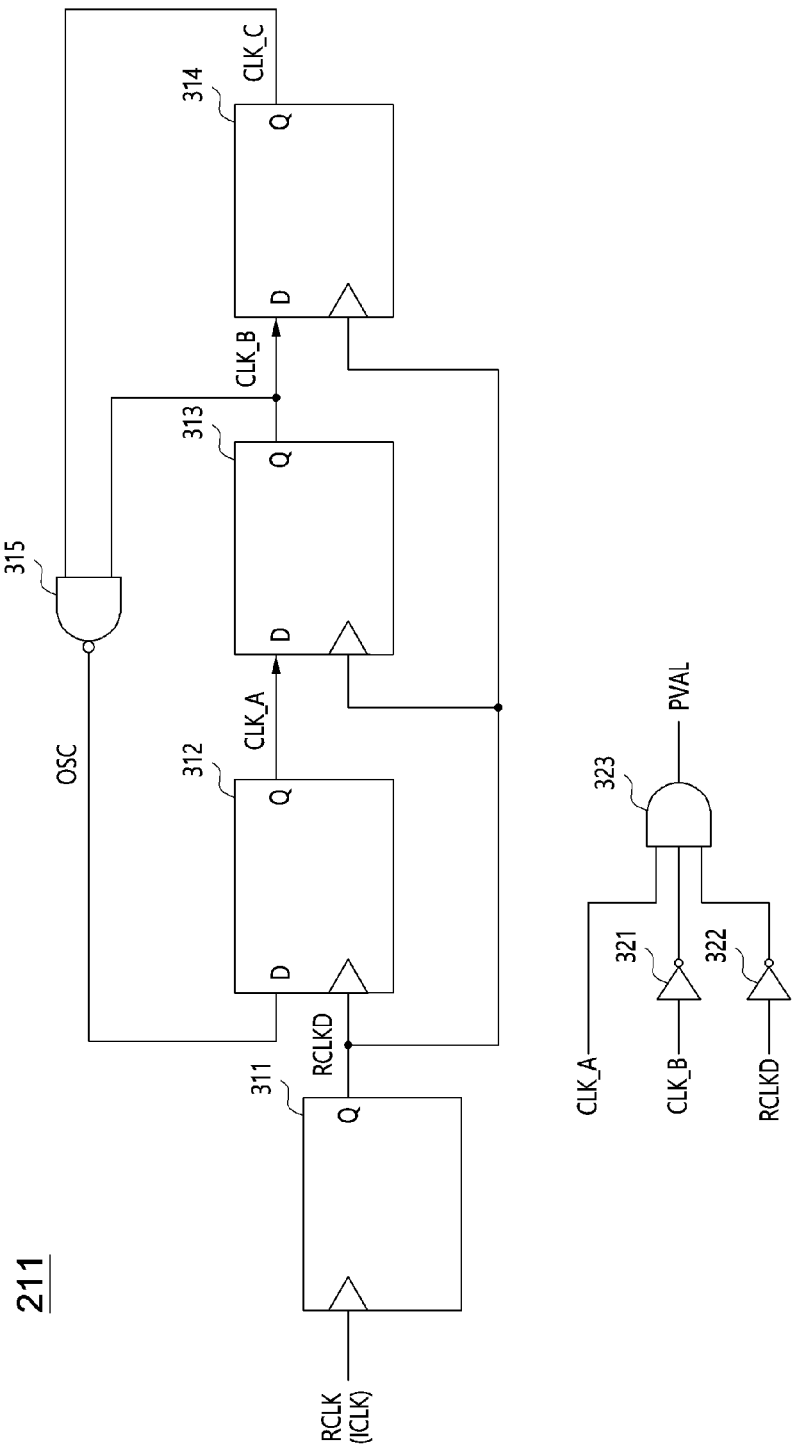
FIG. 3 is a diagram illustrating a construction of an update cycle generation circuit illustrated in FIG. 2.

FIG. 3 is a diagram illustrating a construction of the update cycle generation circuit 211 illustrated in FIG. 2. Referring to FIG. 3, the update cycle generation circuit 211 may include a first flip-flop 311, a second flip-flop 312, a third flip-flop 313, a fourth flip-flop 314, a NAND gate 315, a first inverter 321, a second inverter 322, and an AND gate 323. The first flip-flop 311 may be a T flip-flop. A clock terminal of the first flip-flop 311 may receive the input clock signal RCLK. An output terminal Q of the first flip-flop 311 may output a division clock signal RCLKD. In an embodiment, the clock terminal of the first flip-flop 311 may receive the first phase clock signal ICLK instead of the input clock signal RCLK. The second to fourth flip-flops 312, 313, and 314 may each be a D flip-flop. An input terminal D of the second flip-flop 312 may receive an oscillating signal OSC. A clock terminal of the second flip-flop 312 may receive the division clock signal RCLKD. An output terminal Q of the second flip-flop 312 may output a first clock signal CLK_A. An input terminal D of the third flip-flop 313 may receive the first clock signal CLK_A. A clock terminal of the third flip-flop 313 may receive the division clock signal RCLKD. An output terminal of the third flip-flop 313 may output a second clock signal CLK_B. An input terminal D of the fourth flip-flop 314 may receive the second clock signal CLK_B. A clock terminal of the fourth flip-flop 314 may receive the division clock signal RCLKD. An output terminal of the fourth flip-flop 314 may output a third clock signal CLK_C. The second to fourth flip-flops 312, 313, and 314 may generate the first to third clock signals CLK_A, CLK_B, and CLK_C, respectively, by sequentially delaying the division clock signal RCLKD. The NAND gate 315 may generate the oscillating signal OSC by receiving the second clock signal CLK_B and the third clock signal CLK_C. The first inverter 321 may invert and drive the second clock signal CLK_B. The second inverter 322 may invert and drive the division clock signal RCLKD. The AND gate 323 may receive the first clock signal CLK_A, the output signal of the first inverter 321, and the output signal of the second inverter 322, and may generate the update cycle signal PVAL. The update cycle generation circuit 211 may generate the update cycle signal PVAL that is enabled to a logic high level for the time corresponding to one cycle of the division clock signal RCLKD every predetermined cycle.

Figure 4:
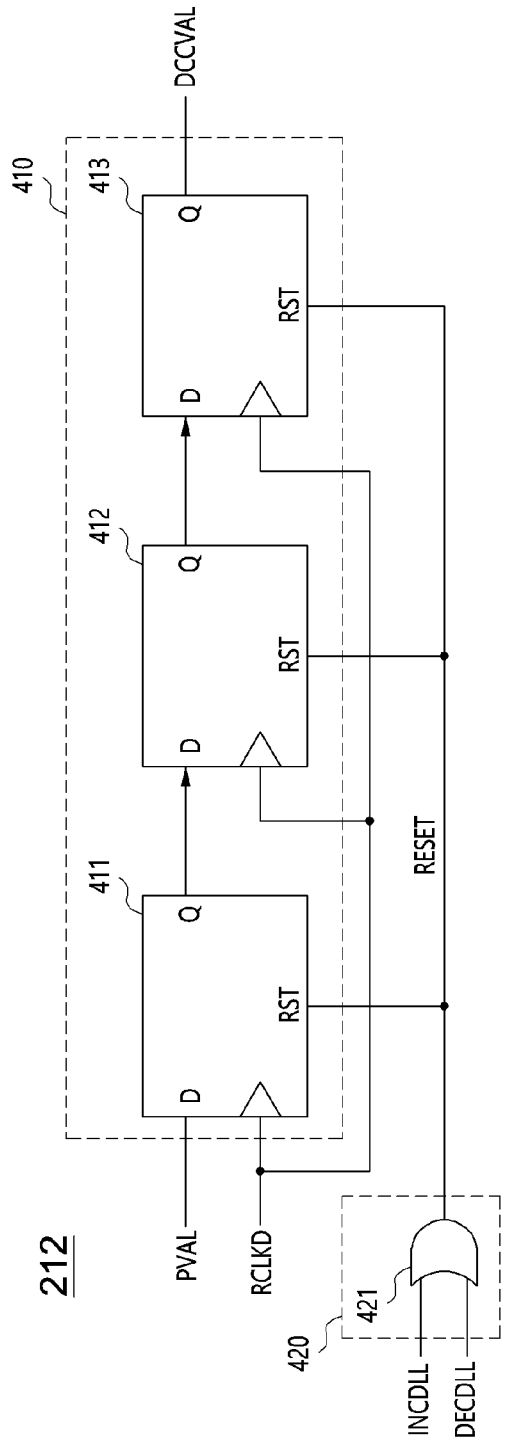
FIG. 4 is a diagram illustrating a construction of a valid signal generation circuit illustrated in FIG. 2.

FIG. 4 is a diagram illustrating a construction of the valid signal generation circuit 212 illustrated in FIG. 2. Referring to FIG. 4, the valid signal generation circuit 212 may include a timing delay circuit 410 and a reset signal generation circuit 420. The timing delay circuit 410 may receive the update cycle signal PVAL, and may generate the valid signal DCCVAL by delaying the update cycle signal PVAL. The timing delay circuit 410 may receive the division clock signal RCLKD in FIG. 3, and may delay the update cycle signal PVAL in synchronization with the division clock signal RCLKD. The delay time of the timing delay circuit 410 may be determined based on the propagation delay time of the delay clock signal CLKD. For example, the propagation delay time may correspond to a delay time that is taken for the delay clock signal to be provided from the delay-locked circuit to the duty correction circuit. The reset signal generation circuit 420 may generate a reset signal RESET by receiving the first delay control signal INCDLL or DECDLL. The reset signal generation circuit 420 may enable the reset signal RESET when at least one of the first increase signal INCDLL and the first decrease signal DECDLL is enabled. The timing delay circuit 410 may receive the reset signal RESET. The timing delay circuit 410 may reset the valid signal DCCVAL in response to the reset signal RESET. The timing delay circuit 410 can prevent or mitigate the valid signal DCCVAL from being generated by resetting the valid signal DCCVAL when the reset signal RESET is enabled while the update cycle signal PVAL is delayed for the delay time.

Figure 5:
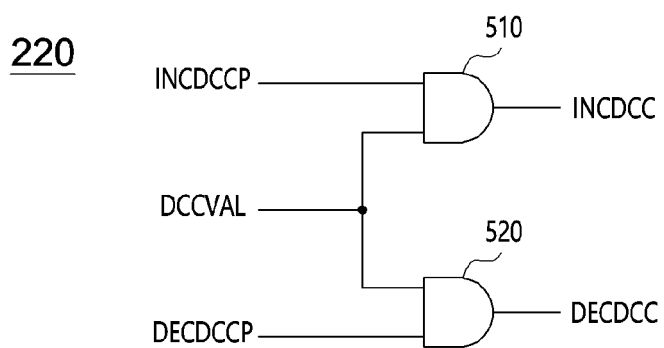
FIG. 5 is a diagram illustrating a construction of an update circuit illustrated in FIG. 2.

The timing delay circuit 410 may include a first flip-flop 411, a second flip-flop 412, and a third flip-flop 413. The first to third flip-flops 411, 412, and 413 may each be a D flip-flop. An input terminal D of the first flip-flop 411 may receive the update cycle signal PVAL. A clock terminal of the first flip-flop 411 may receive the division clock signal RCLKD. An input terminal D of the second flip-flop 412 may be coupled to an output terminal Q of the first flip-flop 411, and may receive the output signal of the first flip-flop 411. A clock terminal of the second flip-flop 412 may receive the division clock signal RCLKD. An input terminal D of the third flip-flop 413 may be coupled to an output terminal Q of the second flip-flop 412, and may receive the output signal of the second flip-flop 412. A clock terminal of the third flip-flop 413 may receive the division clock signal RCLKD. An output terminal Q of the third flip-flop 413 may output the valid signal DCCVAL. The reset terminals RST of the first to third flip-flops 411, 412, and 413 may receive the reset signal RESET in common. The reset signal generation circuit 420 may include an OR gate 421. The OR gate 421 may receive the first increase signal INCDLL and the first decrease signal DECDLL, and may output the reset signal RESET. The OR gate 421 may enable the reset signal RESET to a logic high level when at least one of the first increase signal INCDLL and the first decrease signal DECDLL is enabled to a logic high level. The first to third flip-flops 411, 412, and 413 may generate the valid signal DCCVAL by sequentially delaying the update cycle signal PVAL in synchronization with the division clock signal RCLKD. The first to third flip-flops 411, 412, and 413 may be reset when the reset signal RESET is enabled. Accordingly, when the update cycle signal PVAL is enabled and the first increase signal INCDLL and the first decrease signal DECDLL are enabled while the update cycle signal PVAL is delayed through the first to third flip-flops 411, 412, and 413, the first to third flip-flops 411, 412, and 413 may be reset, and the valid signal DCCVAL may continue to maintain a disabled state. In FIG. 4, it has been illustrated that the timing delay circuit 410 includes the three flip-flops, but the number of flip-flops included in the timing delay circuit 410 may be variously changed depending on a propagation delay time of the delay clock signal CLKD. FIG. 5 is a diagram illustrating a construction of the update circuit 220 illustrated in FIG. 2. Referring to FIG. 5, the update circuit 220 may include a first AND gate 510 and a second AND gate 520. The first AND gate 510 may receive the valid signal DCCVAL and the preliminary increase signal INCDCCP and output the second increase signal INCDCC. The second AND gate 520 may receive the valid signal DCCVAL and the preliminary decrease signal DECDCCP and output the second decrease signal DECDCC. The first AND gate 510 may output the preliminary increase signal INCDCCP as the second increase signal INCDCC only when the valid signal DCCVAL is enabled. The second AND gate 520 may output the preliminary decrease signal DECDCCP as the second decrease signal DECDCC only when the valid signal DCCVAL is enabled.

Figure 6:
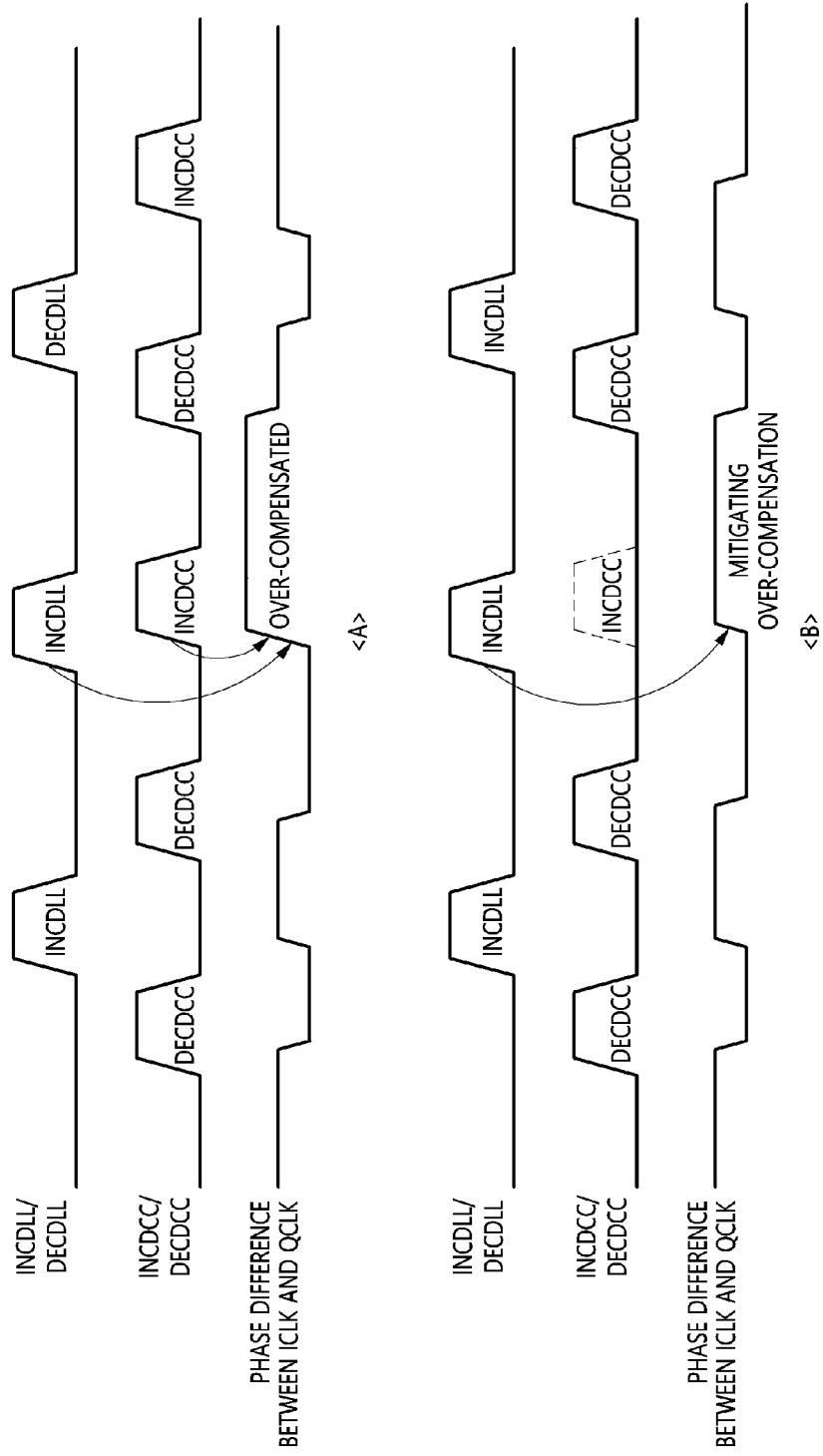
FIG. 6 is a diagram illustrating operations of a comparative clock generation circuit and the clock generation circuit according to an embodiment.

FIG. 6 is a diagram illustrating operations of a comparative clock generation circuit and the clock generation circuit 100 according to an embodiment. An operation of the clock generation circuit 100 according to an embodiment is described as follows with reference to FIGS. 1 to 6. The delay-locked circuit 110 may compare the phases of the input clock signal RCLK and the feedback clock signal FBCLK every update cycle of the delay-locked circuit 110. The first delay control circuit 114 may generate the first delay control signal INCDLL or DECDLL in response to the first phase detection signal PD1 that is output by the first phase detector 113. For example, the delay-locked circuit 110 may generate the first increase signal INCDLL at the first update timing, and may generate the first increase signal INCDLL at the second update timing. The duty correction circuit 120 may compare the phases of the first to fourth phase clock signals ICLK, QCLK, ICLKB, and QCLKB every update cycle of the duty correction circuit 120. The second delay control circuit 124 may generate the second delay control signal INCDCC or DECDCC in response to the second phase detection signal PD2 that is output by the second phase detector 123. For example, the duty correction circuit 120 may generate the second decrease signal DECDCC at the first update timing, may generate the second decrease signal DECDCC at the second update timing, and may generate the second increase signal INCDCC at the third update timing.

When the updates of the delay-locked circuit 110 and the duty correction circuit 120 are performed, a phase difference between the first phase clock signal ICLK and the second phase clock signal QCLK may be changed. For example, when the second decrease signal DEDCC is generated at the first update timing of the duty correction circuit 120, a phase difference between of the first and second phase clock signals ICLK and QCLK may be decreased. When the first increase signal INCDLL is generated at the first update timing of the delay-locked circuit 110, a phase difference between the first and second phase clock signals ICLK and QCLK may be increased. When the second decrease signal DECDCC is generated at the second update timing of the duty correction circuit 120, a phase difference between the first and second phase clock signals ICLK and QCLK may be decreased.

The second update timing of the delay-locked circuit 110 and the third update timing of the duty correction circuit 120 may overlap. In the case of the comparative clock generation circuit <A>, the update of the delay-locked circuit 110 and the update of the duty correction circuit 120 may be performed simultaneously. When the first increase signal INCDLL is generated at the second update timing of the delay-locked circuit 110 and the second increase signal INCDCC is generated at the third update timing of the duty correction circuit 120, the delay times of the first delay circuit 111 and the second delay circuit 121 may be increased simultaneously, and a phase difference between the first and second phase clock signals ICLK and QCLK may be over-compensated for. If a phase difference between the first and second clock signals ICLK and QCLK is greatly changed, a random jitter and a malfunction may occur in internal circuits that operate in response to the first and second phase clock signals ICLK and QCLK.

In the case of the clock generation circuit 100<B> according to an embodiment, the second delay control circuit 124 can prevent or mitigate the update of the duty correction circuit 120 from being performed when the update timing of the delay-locked circuit 110 and the update timing of the duty correction circuit 120 overlap. Although the update cycle signal PVAL is generated, the valid signal generation circuit 212 of the update control circuit 130 might not generate the valid signal DCCVAL from the update cycle signal PVAL in response to the first increase signal INCDLL that is generated by the delay-locked circuit 110. The update circuit 220 may receive the preliminary increase signal INCDCCP that is generated in response to the second phase detection signal PD2, but may block the preliminary increase signal INCDCCP from being output as the second increase signal INCDCC because the valid signal DCCVAL is in the state in which the valid signal DCCVAL has been disabled. Accordingly, in an embodiment, a phase difference between the first and second phase clock signals ICLK and QCLK might not be over-compensated for because the update of the delay-locked circuit 110 is performed, but the update of the duty correction circuit 120 is not performed. Accordingly, in an embodiment, a phase difference between the first and second phase clock signals ICLK and QCLK might not be excessively changed, the occurrence of the random jitter can be reduced, and the possibility that a malfunction of the internal circuits that operate in response to the first and second phase clock signals ICLK and QCLK may occur can be reduced.

In the case of the comparative clock generation circuit <A>, as a phase difference between the first and second phase clock signals ICLK and QCLK is over-compensated for, the second decrease signal DECDCC may be generated at the fourth update timing of the duty correction circuit 120, and the first decrease signal DECDLL may be generated at the third update timing of the delay-locked circuit 110. The second increase signal INCDCC may be generated at the fifth update timing of the duty correction circuit 120. In contrast, in the case of the clock generation circuit 100 <B> according to an embodiment, the second decrease signal DECDCC may be generated at the fourth update timing of the duty correction circuit 120 (i.e., timing at which the update of the duty correction circuit 120 is performed for the third time) and the first increase signal INCDLL may be generated at the third update timing of the delay-locked circuit 110 because a phase difference between the first and second phase clock signals ICLK and QCLK is not over-compensated for. The second decrease signal DECDCC may be generated at the fifth update timing of the duty correction circuit 120 (i.e., timing at which the update of the duty correction circuit 120 is performed for the fourth time). In an embodiment, the clock generation circuit 100 can reduce the occurrence of a random jitter and reduce a malfunction of the internal circuits because the clock generation circuit 100 can prevent or mitigate a phase difference between the first and second phase clock signals ICLK and QCLK from being greatly changed undesirably compared to the comparative clock generation circuit.

Figure 7:
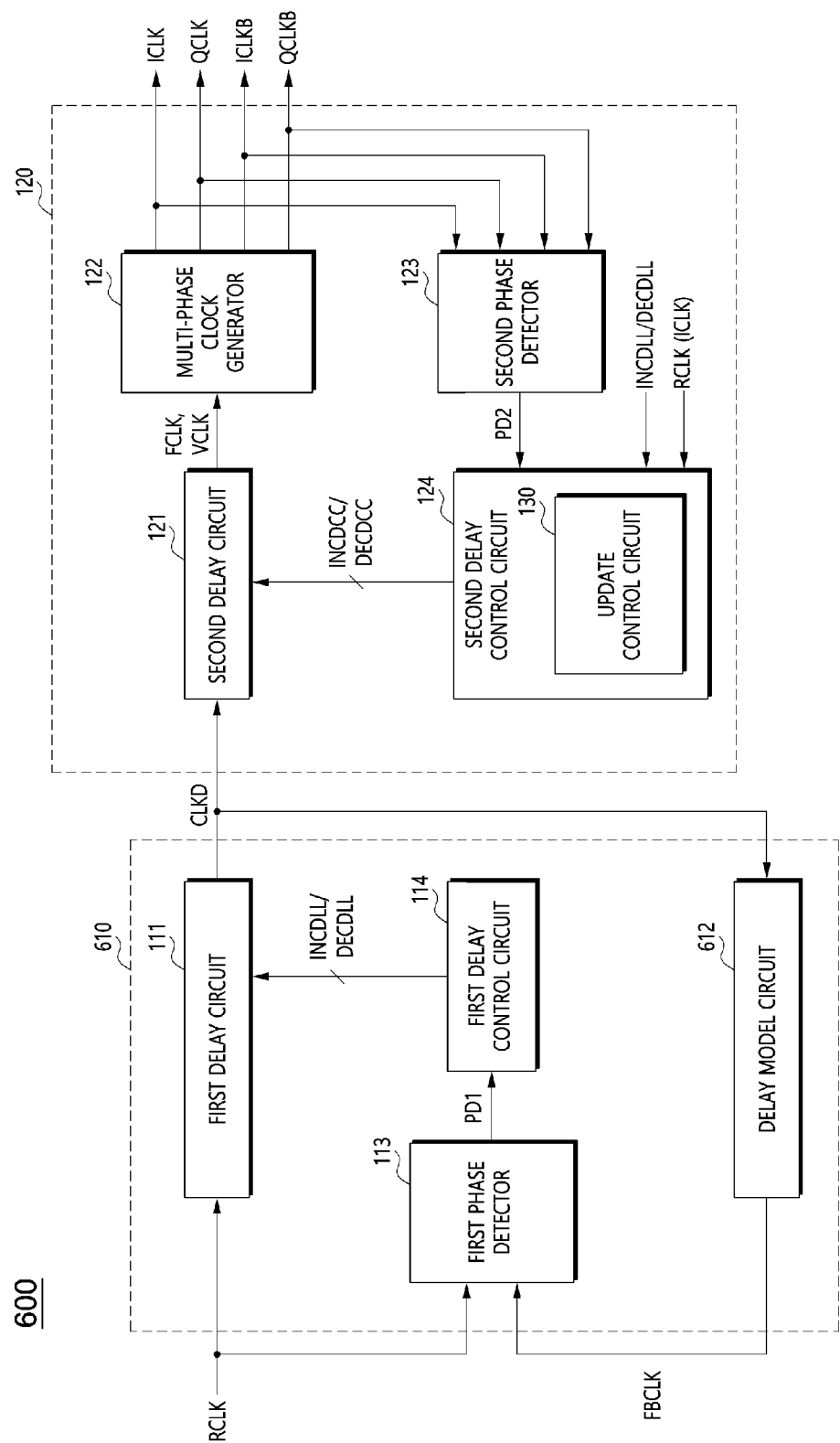
FIG. 7 is a diagram illustrating a construction of a clock generation circuit according to an embodiment.

FIG. 7 is a diagram illustrating a construction of a clock generation circuit 600 according to an embodiment. Referring to FIG. 7, the clock generation circuit 600 may include a delay-locked circuit 610 and a duty correction circuit 120. The delay-locked circuit 610 may include a first delay circuit 111, a delay model circuit 612, a first phase detector 113, and a first delay control circuit 114. The duty correction circuit 120 may include a second delay circuit 121, a multi-phase clock generator 122, a second phase detector 123, and a second delay control circuit 124. The clock generation circuit 600 may include substantially the same components as the clock generation circuit 100 illustrated in FIG. 1 except the delay model circuit 612. The same components are assigned the same reference numerals, and a redundant description of the same components is omitted. The delay model circuit 612 may receive the delay clock signal CLKD instead of the first phase clock signal ICLK. The delay model circuit 612 may generate the feedback clock signal FBCLK by delaying the delay clock signal CLKD. The delay model circuit 612 may generate the feedback clock signal FBCLK by delaying the delay clock signal CLKD by the delay compensation time. The delay-locked circuit 610 may perform a delay-locked operation on the input clock signal RCLK in response to the feedback clock signal FBCLK that is generated from the delay clock signal CLKD.

Figure 8:
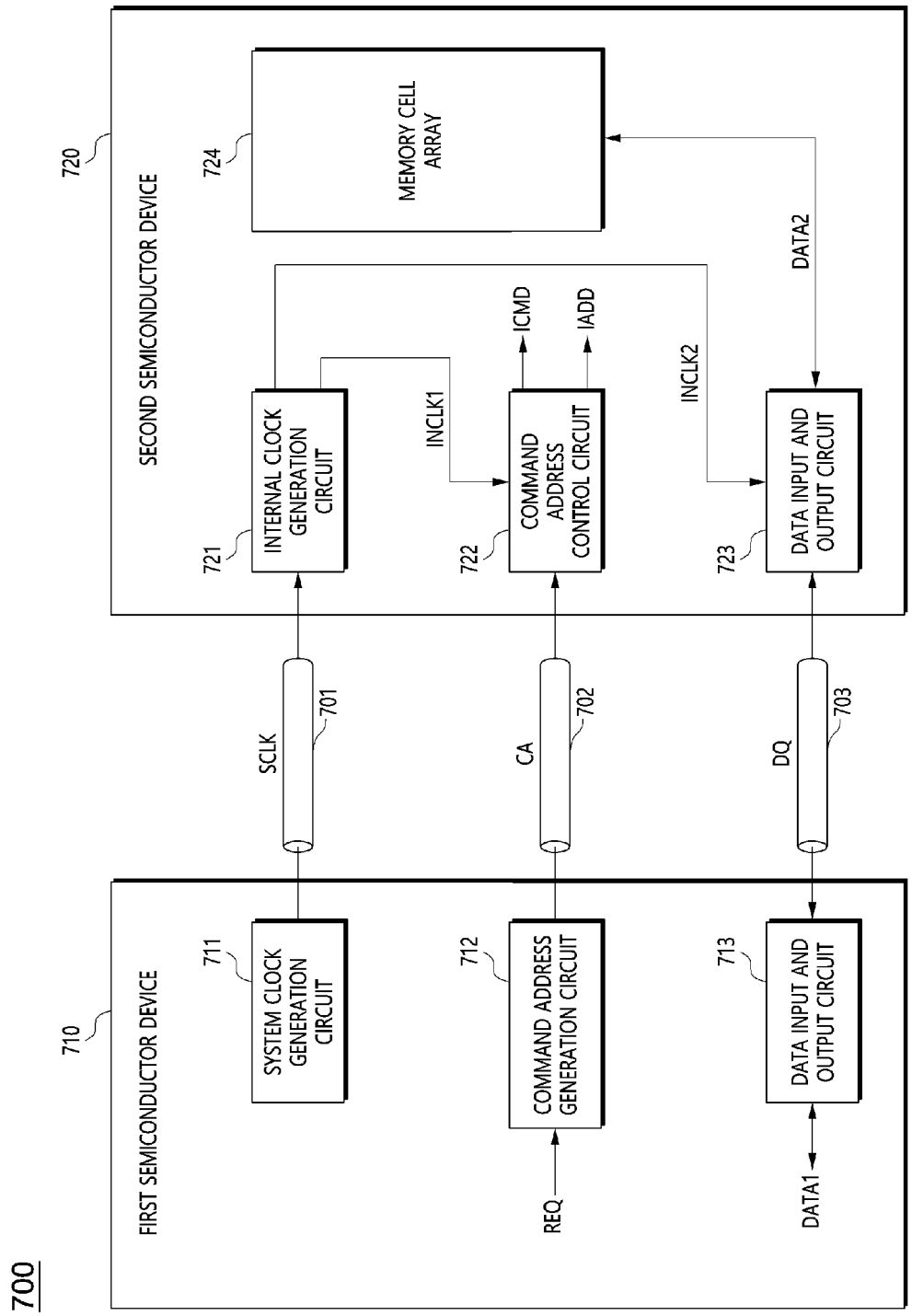
FIG. 8 is a diagram illustrating a construction of a semiconductor system according to an embodiment.

FIG. 8 is a diagram illustrating a construction of a semiconductor system 700 according to an embodiment. In FIG. 8, the semiconductor system 700 may include a first semiconductor device 710 and a second semiconductor device 720. The first semiconductor device 710 may be a master device that provides various control signals that are necessary for the second semiconductor device 720 to operate. The second semiconductor device 720 may be a slave device that is controlled by the first semiconductor device 710 and that performs various operations. The first semiconductor device 710 may include various types of host devices. For example, the first semiconductor device 710 may include a central processing unit (CPU), a graphic processing unit (GPU), a multi-media processor (MMP), a digital signal processor, an application processor (AP), and a memory controller. The second semiconductor device 720 may be a memory device, for example. The memory device may include volatile memory and nonvolatile memory. The volatile memory may include static RAM (SRAM), dynamic RAM (DRAM), and synchronous DRAM (SDRAM). The nonvolatile memory may include read only memory (ROM), programmable ROM (PROM), electrically erasable PROM (EEPROM), electrically programmable ROM (EPROM), flash memory, phase change RAM (PRAM), magnetic RAM (MRAM), resistive RAM (RRAM), and ferroelectric RAM (FRAM).

The second semiconductor device 720 may be coupled to the first semiconductor device 710 through a plurality of buses. The plurality of buses may each be a signal transmission path, a link, or a channel for transmitting a signal. The plurality of buses may include a clock bus 701, a command address bus 702, and a data bus 703. The clock bus 701 and the command address bus 702 may each be a unidirectional bus from the first semiconductor device 710 to the second semiconductor device 720. The data bus 703 may be a bidirectional bus. The second semiconductor device 720 may be coupled to the first semiconductor device 710 through the clock bus 701, and may receive a system clock signal SCLK through the clock bus 701. In an embodiment, the system clock signal SCLK may be transmitted along with a complementary signal. The second semiconductor device 720 may be coupled to the first semiconductor device 710 through the command address bus 702, and may receive a command address signal CA from the first semiconductor device 710 through the command address bus 702. The command address signal CA may include a plurality of bits. The first semiconductor device 710 may transmit the command address signal CA in response to the system clock signal SCLK. The second semiconductor device 720 may receive the command address signal CA in response to the system clock signal SCLK. The first semiconductor device 710 may transmit the command address signal CA in synchronization with the system clock signal SCLK. The second semiconductor device 720 may synchronize the received command address signal CA with the system clock signal SCLK. The second semiconductor device 720 may be coupled to the first semiconductor device 710 through the data bus 703, and may receive data DQ from the first semiconductor device 710 or transmit the data DQ to the first semiconductor device 710 through the data bus 703. The first semiconductor device 710 may transmit the data DQ to the second semiconductor device 720 in synchronization with the system clock signal SCLK. The second semiconductor device 720 may transmit the data DQ to the first semiconductor device 710 in synchronization with the system clock signal SCLK.

The first semiconductor device 710 may include a system clock generation circuit 711, a command address generation circuit 712, and a data input and output circuit 713. The system clock generation circuit 711 may generate the system clock signal SCLK. The system clock generation circuit 711 may include any clock generator for generating the system clock signal SCLK. For example, the system clock generation circuit 711 may include an oscillator, a phase-locked loop circuit, or a delay-locked loop circuit. The system clock generation circuit 711 may generate the system clock signal SCLK having a frequency that is suitable for the first and second semiconductor devices 710 and 720 to communicate with each other. The system clock generation circuit 711 may transmit the system clock signal SCLK to the second semiconductor device 720 through the clock bus 701. The system clock generation circuit 711 may provide the system clock signal SCLK to the command address generation circuit 712 and the data input and output circuit 713.

The command address generation circuit 712 may generate the command address signal CA in response to a request REQ. The command address generation circuit 712 may generate the command address signal CA that instructs the second semiconductor device 720 to perform various operations, in response to the request REQ. The command address generation circuit 712 may transmit the command address signal CA to the second semiconductor device 720 through the command address bus 702. The command address generation circuit 712 may receive the system clock signal SCLK, and may transmit the command address signal CA to the command address bus 702 in synchronization with the system clock signal SCLK.

The data input and output circuit 713 may be coupled to the second semiconductor device 720 through the data bus 703, and may transmit the data DQ to the second semiconductor device 720 or receive the data DQ that is transmitted by the second semiconductor device 720, through the data bus 703. The data input and output circuit 713 may generate the data DQ based on internal data DATA1 of the first semiconductor device 710, and may transmit the data DQ to the second semiconductor device 720 through the data bus 703. The data input and output circuit 713 may receive the data DQ that is transmitted by the second semiconductor device 720 through the data bus 703, and may generate the internal data DATA1 based on the data DQ. The data input and output circuit 713 may receive the system clock signal SCLK, and may perform a data input and output operation in response to the system clock signal SCLK. The data input and output circuit 713 may transmit the internal data DATA1 of the first semiconductor device 710 as the data DQ in synchronization with the system clock signal SCLK, and may generate the internal data DATA1 from the data DQ in synchronization with the system clock signal SCLK.

The second semiconductor device 720 may include an internal clock generation circuit 721, a command address control circuit 722, a data input and output circuit 723, and a memory cell array 724. The internal clock generation circuit 721 may receive the system clock signal SCLK, and may generate a plurality of internal clock signals in response to the system clock signal SCLK through the clock bus 701. For example, the internal clock generation circuit 721 may generate a first internal clock signal INCLK1 and a second internal clock signal INCLK2. The first and second internal clock signals INCLK1 and INCLK2 may each generate a plurality of phase clock signals having different phases. The first internal clock signal INCLK1 may have the same frequency as the second internal clock signal INCLK2, and may have a frequency different from the frequency of the second internal clock signal INCLK2. The internal clock generation circuit 721 may delay the system clock signal SCLK order to compensate for the delay time of a clock path along which the system clock signal SCLK and the first and second internal clock signals INCLK1 and INCLK2 are transmitted. The internal clock generation circuit 721 may adjust a difference between the phases of the plurality of phase clock signals that are included in each of the first and second internal clock signals INCLK1 and INCLK2. The clock generation circuit 100 illustrated in FIG. 1 may be applied as the internal clock generation circuit 721. The internal clock generation circuit 721 may provide the first internal clock signal INCLK1 to the command address control circuit 722 and provide the second internal clock signal INCLK2 to the data input and output circuit 723.

The command address control circuit 722 may be coupled to the command address bus 702, and may receive the command address signal CA that is transmitted by the first semiconductor device 710. The command address control circuit 722 may receive the first internal clock signal INCLK1 from the internal clock generation circuit 721, and may synchronize the command address signal CA with the first internal clock signal INCLK1. The command address control circuit 722 may generate an internal command signal ICMD and an internal address signal IADD so that the second semiconductor device 720 can perform various operations, by decoding the command address signal CA. The command address control circuit 722 may provide the internal command signal ICMD and the internal address signal IADD to the memory cell array 724.

The data input and output circuit 723 may be coupled to the first semiconductor device 710 through the data bus 703, and may transmit the data DQ to the first semiconductor device 710 or receive the data DQ that is transmitted by the first semiconductor device 710, through the data bus 703. The data input and output circuit 723 may generate the data DQ based on internal data DATA2 of the second semiconductor device 720, and may transmit the data DQ to the first semiconductor device 710 through the data bus 703. The data input and output circuit 723 may receive the data DQ that is transmitted by the first semiconductor device 710 through the data bus 703, and may generate the internal data DATA2 based on the data DQ. The data input and output circuit 723 may receive the second internal clock signal INCLK2 that is generated by the internal clock generation circuit 721. The data input and output circuit 723 may perform an input and output operation on the data DQ in response to the second internal clock signal INCLK2. The data input and output circuit 723 may transmit the data DQ to the first semiconductor device 710 in synchronization with the second internal clock signal INCLK2, and may receive the data DQ that is transmitted by the first semiconductor device 710 in synchronization with the second internal clock signal INCLK2.

Data that is received from the first semiconductor device 710 through the data input and output circuit 723 may be stored in the memory cell array 724. The data that has been stored in the memory cell array 724 may be output to the first semiconductor device 710 through the data input and output circuit 723. The memory cell array 724 may include a plurality of memory cells. Although not illustrated, the memory cell array may include a plurality of bit lines and a plurality of word lines, and may include a plurality of memory cells that are coupled to points at which the plurality of bit lines and the plurality of word lines are intersected, respectively. The memory cell array 724 may receive the internal address signal IADD from the command address control circuit 722, and may select a specific bit line, among the plurality of bit lines, and select a specific word line, among the plurality of word lines, in response to the internal address signal IADD. When the specific bit line and the specific word line are selected, a memory cell that is coupled between the selected bit line and the selected word line may be accessed. Although not illustrated, the memory cell array 724 may include a column decoding circuit for selecting the specific bit line and a row decoding circuit for selecting the specific word line, in response to the internal address signal IADD. The memory cell array 724 may receive the internal command signal ICMD from the command address control circuit 722, and may store data in the accessed memory cell or output data from the accessed memory cell in response to the internal command signal ICMD. The memory cell array 724 may be coupled to the data input and output circuit 723, and may provide the internal data DATA2 to the data input and output circuit 723 or receive the internal data DATA2 from the data input and output circuit 723. The memory cell array 724 may store the internal data DATA2 in the accessed memory cell in response to the internal command signal ICMD. The memory cell array 724 may generate the internal data DATA2 from data that has been stored in the accessed memory cell, in response to the internal command signal ICMD. Although not illustrated, the memory cell array 724 may include a write circuit for writing the internal data DATA2 in the memory cell array 724 and a read circuit for outputting the internal data DATA2 by reading data stored in the memory cell array 724.

Those skilled in the art to which the present technology pertains may understand that the present technology may be implemented in various other forms without departing from the technical spirit or essential characteristics of the present technology. It is to be understood that the aforementioned embodiments are illustrative from all aspects not being limitative. The scope of the present technology is defined by the appended claims rather than by the detailed description, and all modifications or variations derived from the meanings and scope of the claims and equivalents thereof should be understood as being included in the scope of the present technology.

What is claimed is:

1. A clock generation circuit comprising:
   a delay-locked circuit configured to generate a delay clock signal by delaying an input clock signal and configured to update a delay time of the input clock signal by comparing phases of the input clock signal and a feedback clock signal; and
   a duty correction circuit configured to generate a first phase clock signal and a second phase clock signal by delaying the delay clock signal, configured to update a delay time of the delay clock signal by comparing phases of the first and second phase clock signals, and configured to prevent the delay time of the input clock signal and the delay time of the delay clock signal from being updated simultaneously.

2. The clock generation circuit according to claim 1, wherein the feedback clock signal is generated by delaying the first phase clock signal.

3. The clock generation circuit according to claim 1, wherein the feedback clock signal is generated by delaying the delay clock signal.

4. The clock generation circuit according to claim 1, wherein the delay-locked circuit comprises:
   a first delay circuit configured to generate the delay clock signal by delaying the input clock signal in response to a first delay control signal;
   a delay model circuit configured to generate the feedback clock signal by delaying the first phase clock signal by a delay compensation time;
   a first phase detector configured to generate a first phase detection signal by comparing the phases of the input clock signal and the feedback clock signal; and
   a first delay control circuit configured to generate the first delay control signal in response to the first phase detection signal.

5. The clock generation circuit according to claim 1, wherein the delay-locked circuit comprises:
   a first delay circuit configured to generate the delay clock signal by delaying the input clock signal in response to the first delay control signal;
   a delay model circuit configured to generate the feedback clock signal by delaying the delay clock signal by a delay compensation time;
   a first phase detector configured to generate the first phase detection signal by comparing the phases of the input clock signal and the feedback clock signal; and a first delay control circuit configured to generate the first delay control signal in response to the first phase detection signal.

6. The clock generation circuit according to claim 1, wherein the duty correction circuit comprises:
a second delay circuit configured to generate a fixed delay clock signal by delaying the delay clock signal and configured to generate a variable delay clock signal by delaying the delay clock signal in response to the second delay control signal;
a multi-phase clock generator configured to generate the first phase clock signal in response to the fixed delay clock signal and configured to generate the second phase clock signal in response to the variable delay clock signal;
a second phase detector configured to generate a second phase detection signal by comparing the phases of the first and second phase clock signals; and
a second delay control circuit configured to generate the second delay control signal in response to the second phase detection signal and the first delay control signal.

7. The clock generation circuit according to claim 6, wherein the second delay control circuit generates a preliminary delay control signal in response to the second phase detection signal and selectively outputs the preliminary delay control signal as the second delay control signal in response to the first delay control signal.

8. The clock generation circuit according to claim 6, wherein the second delay control circuit generates a preliminary delay control signal in response to the second phase detection signal and prevents the preliminary delay control signal from being output as the second delay control signal when a pulse of the preliminary delay control signal at least partially overlaps a pulse of the first delay control signal.

9. The clock generation circuit according to claim 6, wherein:
the second delay control circuit generates a preliminary delay control signal in response to the second phase detection signal, and
the second delay control circuit further comprises an update control circuit configured to selectively output the preliminary delay control signal as the second delay control signal in response to the first delay control signal.

10. The clock generation circuit according to claim 9, wherein the update control circuit comprises:
a cycle control circuit configured to generate an update cycle signal that is enabled every predetermined cycle and configured to selectively output the update cycle signal as a valid signal in response to the first delay control signal; and
an update circuit configured to output the preliminary delay control signal as the second delay control signal in response to the valid signal.

11. The clock generation circuit according to claim 10, wherein the cycle control circuit blocks the update cycle signal from being output as the valid signal when a pulse of the first delay control signal and a pulse of the update cycle signal overlap.

12. The clock generation circuit according to claim 10, wherein the valid signal generation circuit comprises:
a reset signal generation circuit configured to generate a reset signal in response to the first delay control signal; and
a timing delay circuit configured to generate the valid signal by delaying the update cycle signal and configured to reset the valid signal in response to the reset signal.

13. The clock generation circuit according to claim 10, wherein when an update operation interval of the duty correction circuit at least partially overlaps an update operation interval of the delay-locked circuit, the duty correction circuit does not perform an update operation of updating the delay time of the delay clock signal by comparing the phases of the first and second phase clock signals, and the delay-locked circuit performs an update operation by updating the delay time of the input clock signal by comparing the phases of the input clock signal and the feedback clock signal.

14. A clock generation circuit comprising:
a delay-locked circuit configured to generate a first delay control signal by comparing an input clock signal and a feedback clock signal and configured to generate a delay clock signal by delaying the input clock signal in response to the first delay control signal;
a delay circuit configured to generate a first phase clock signal by delaying the delay clock signal and configured to generate a second phase clock signal by delaying the delay clock signal in response to a second delay control signal;
a phase detector configured to generate a phase detection signal by comparing a phase of the first phase clock signal with a phase of the second phase clock signal; and
a delay control circuit configured to generate a second delay control signal in response to the phase detection signal and configured to selectively provide the second delay control signal to the delay circuit in response to the first delay control signal.

15. The clock generation circuit according to claim 14, wherein the feedback clock signal is generated by delaying the first phase clock signal.

16. The clock generation circuit according to claim 14, wherein the feedback clock signal is generated by delaying the delay clock signal.

17. The clock generation circuit according to claim 14, wherein the delay circuit comprises:
a fixed delay circuit configured to generate the first phase clock signal by delaying the delay clock signal by a fixed delay time; and
a variable delay circuit configured to generate the second phase clock signal by delaying the delay clock signal by a variable delay time in response to the second delay control signal.

18. The clock generation circuit according to claim 14, wherein the delay control circuit generates a preliminary delay control signal in response to the second phase detection signal and selectively outputs the preliminary delay control signal as the second delay control signal in response to the first delay control signal.

19. The clock generation circuit according to claim 14, wherein the delay control circuit generates a preliminary delay control signal in response to the second phase detection signal and prevents the preliminary delay control signal from being output as the second delay control signal when a pulse of the preliminary delay control signal at least partially overlaps a pulse of the first delay control signal.

20. The clock generation circuit according to claim 14, wherein:
the delay control circuit generates a preliminary delay control signal in response to the phase detection signal, and the delay control circuit further comprises an update control circuit configured to selectively output the preliminary delay control signal as the second delay control signal in response to the first delay control signal.

21. The clock generation circuit according to claim 20, wherein the update control circuit comprises:
- a cycle control circuit configured to generate an update cycle signal that is enabled every predetermined cycle and configured to selectively output the update cycle signal as a valid signal in response to the first delay control signal; and
- an update circuit configured to output the preliminary delay control signal as the second delay control signal in response to the valid signal.

22. The clock generation circuit according to claim 1, wherein simultaneous update comprises when an update operation interval of the duty correction circuit 120 at least partially overlaps the update operation interval of the delay-locked circuit 110.

* * * * *